(12) United States Patent
Mahmoud et al.

(10) Patent No.: US 11,309,434 B2
(45) Date of Patent: Apr. 19, 2022

(54) SEMICONDUCTOR DEVICE AND METHOD OF PRODUCING THE SAME

(71) Applicant: Infineon Technologies Dresden GmbH & Co. KG, Dresden (DE)

(72) Inventors: Ahmed Mahmoud, Munich (DE); Rolf Weis, Dresden (DE); Armin Willmeroth, Friedberg (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/815,621

(22) Filed: Mar. 11, 2020

(65) Prior Publication Data
US 2020/0295202 A1 Sep. 17, 2020

(30) Foreign Application Priority Data
Mar. 14, 2019 (EP) ..................................... 19162743

(51) Int. Cl.
*H01L 29/06* (2006.01)
*H01L 29/808* (2006.01)
*H01L 29/66* (2006.01)

(52) U.S. Cl.
CPC ........ *H01L 29/808* (2013.01); *H01L 29/0634* (2013.01); *H01L 29/66901* (2013.01)

(58) Field of Classification Search
CPC combination set(s) only.
See application file for complete search history.

(56) References Cited

U.S. PATENT DOCUMENTS

| 5,099,303 A | * | 3/1992 | Kato | H01L 27/0623 |
| | | | | 257/370 |
| 7,935,601 B1 | | 5/2011 | Neudeck | |
| 2011/0127586 A1 | | 6/2011 | Bobde et al. | |
| 2015/0014742 A1 | * | 1/2015 | Lu | H01L 21/265 |
| | | | | 257/139 |
| 2017/0092716 A1 | * | 3/2017 | Mauder | H01L 29/0696 |
| 2017/0365710 A1 | * | 12/2017 | Bobde | H01L 29/405 |
| 2019/0334036 A1 | * | 10/2019 | Chun | H01L 29/0615 |

FOREIGN PATENT DOCUMENTS

EP 3503198 A1 6/2019

\* cited by examiner

*Primary Examiner* — Moin M Rahman
(74) *Attorney, Agent, or Firm* — Murphy, Bilak & Homiller, PLLC

(57) ABSTRACT

A semiconductor device includes a layer stack with a plurality of first semiconductor layers of a first doping type and a plurality of second semiconductor layers of a second doping type complementary to the first doping type. A first semiconductor region of a first semiconductor device adjoins the first semiconductor layers. Each second semiconductor region of the first semiconductor device adjoins at least one of the second semiconductor layers, and is spaced apart from the first semiconductor region. A third semiconductor layer adjoins the layer stack and each first semiconductor region and each second semiconductor region. The third semiconductor layer includes a first region arranged between the first semiconductor region and the second semiconductor region in a first direction. A third semiconductor region of the first or the second doping type extends from a first surface of the third semiconductor layer into the first region.

18 Claims, 9 Drawing Sheets

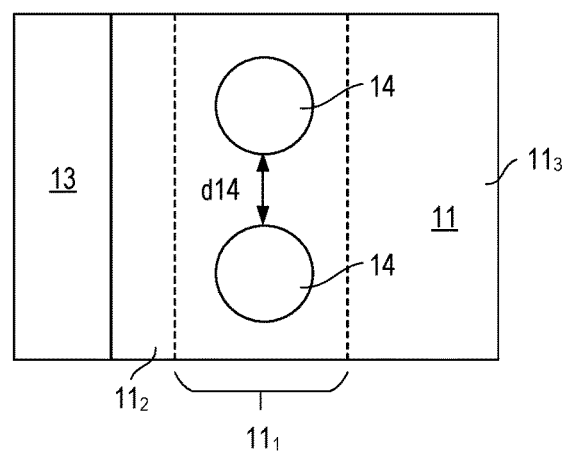
FIG 1C
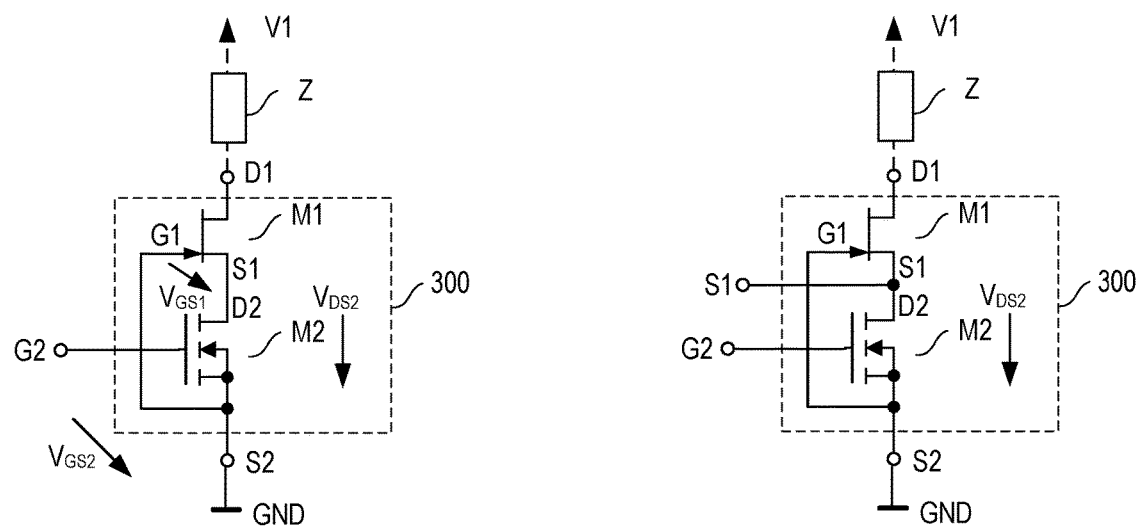
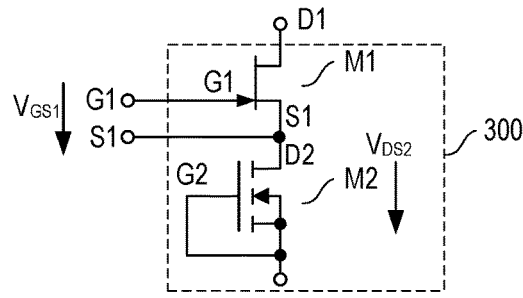
FIG 2A
FIG 2B
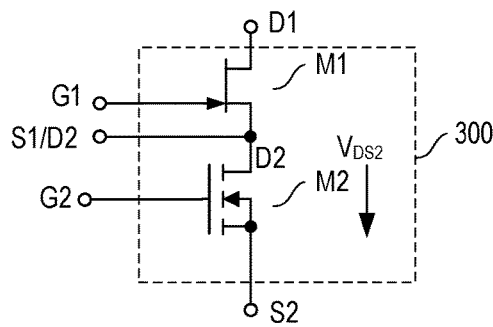
FIG 2C
FIG 2D

SEMICONDUCTOR DEVICE AND METHOD OF PRODUCING THE SAME

TECHNICAL FIELD

This disclosure in general relates to a semiconductor device, in particular a semiconductor device with a transistor arrangement.

BACKGROUND

Usually, transistor arrangements include a plurality of transistor devices formed in a semiconductor body. A superjunction transistor device, for example, usually includes at least one drift region of a first doping type (conductivity type) and a compensation region of a second doping type (conductivity type) complementary to the first doping type. The drift region and the compensation region are connected such that in an on-state (switched on state) of the transistor device a current can flow in the drift region, while in the off-state (switched off state) a depletion region expands in the drift region and a current flow through the drift region is suppressed. A transistor arrangement including a plurality of superjunction transistor devices, therefore, includes a plurality of drift regions and compensation regions. The drift regions and compensation regions of a transistor arrangement may be implemented as a layer stack with a plurality of first semiconductor layers of the first doping type and a plurality of second semiconductor layers of the second doping type.

Interface charges induced, e.g., by a mold material arranged adjacent to the transistor device may migrate into the transistor arrangement, adversely affecting the functionality of the transistor device, e.g., by influencing compensation and impairing the blocking capability of the device.

It is desirable to provide a semiconductor device that is more robust against and less affected by interface charges, and to provide a fast and cost effective method for producing the same.

SUMMARY

One example relates to a semiconductor device including a layer stack with a plurality of first semiconductor layers of a first doping type and a plurality of second semiconductor layers of a second doping type complementary to the first doping type. The semiconductor device further includes a first semiconductor region of a first semiconductor device adjoining the plurality of first semiconductor layers, at least one second semiconductor region of the first semiconductor device, wherein each of the at least one second semiconductor region adjoins at least one of the plurality of second semiconductor layers, and is spaced apart from the first semiconductor region, and a third semiconductor layer adjoining the layer stack and each of the first semiconductor region and the at least one second semiconductor region, wherein the third semiconductor layer includes a first region arranged between the first semiconductor region and the at least one second semiconductor region in a first direction. The semiconductor device further includes a third semiconductor region of the first or the second doping type, extending from a first surface of the third semiconductor layer into the first region.

One example relates to a method for producing a semiconductor device includes forming a layer stack with a plurality of first layers of a first doping type and a plurality of second layers of a second doping type complementary to the first doping type, forming a third layer on top of the layer stack, forming a first semiconductor region such that the first semiconductor region adjoins the plurality of first semiconductor layers, forming at least one second semiconductor region such that each of the at least one second semiconductor region adjoins at least one of the plurality of second semiconductor layers, and is spaced apart from the first semiconductor region, and forming a third semiconductor region of the first doping type or the second doping type such that the third semiconductor region extends from a first surface into a first region of the third semiconductor layer, wherein the first region is arranged between the first semiconductor region and the at least one second semiconductor region in a first direction.

Another example relates to a semiconductor device including a layer stack with a plurality of first semiconductor layers of a first doping type and a plurality of second semiconductor layers of a second doping type complementary to the first doping type, a first semiconductor region of a first semiconductor device adjoining the plurality of first semiconductor layers, at least one second semiconductor region of the first semiconductor device, wherein each of the at least one second semiconductor region adjoins at least one of the plurality of second semiconductor layers, and is spaced apart from the first semiconductor region, and a third semiconductor layer adjoining the layer stack and each of the first semiconductor region and the at least one second semiconductor region. Each of the plurality of first semiconductor layers has a first thickness in a vertical direction that is perpendicular to the first direction, each of the plurality of second semiconductor layers has a second thickness in the vertical direction, and the third semiconductor layer has a thickness in the vertical direction that is at least twice the sum of the first thickness and the second thickness.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 1A-1C schematically illustrate a perspective sectional view (FIG. 1A), a vertical cross-sectional view (FIG. 1B), and a horizontal cross sectional view (FIG. 1C) of a transistor arrangement that includes a first transistor device and a second transistor device integrated in one semiconductor body;

FIGS. 2A-2D show equivalent circuit diagrams that illustrate how the first transistor device and the second transistor device in a transistor arrangement of the type shown in FIGS. 1A-1C may be connected;

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
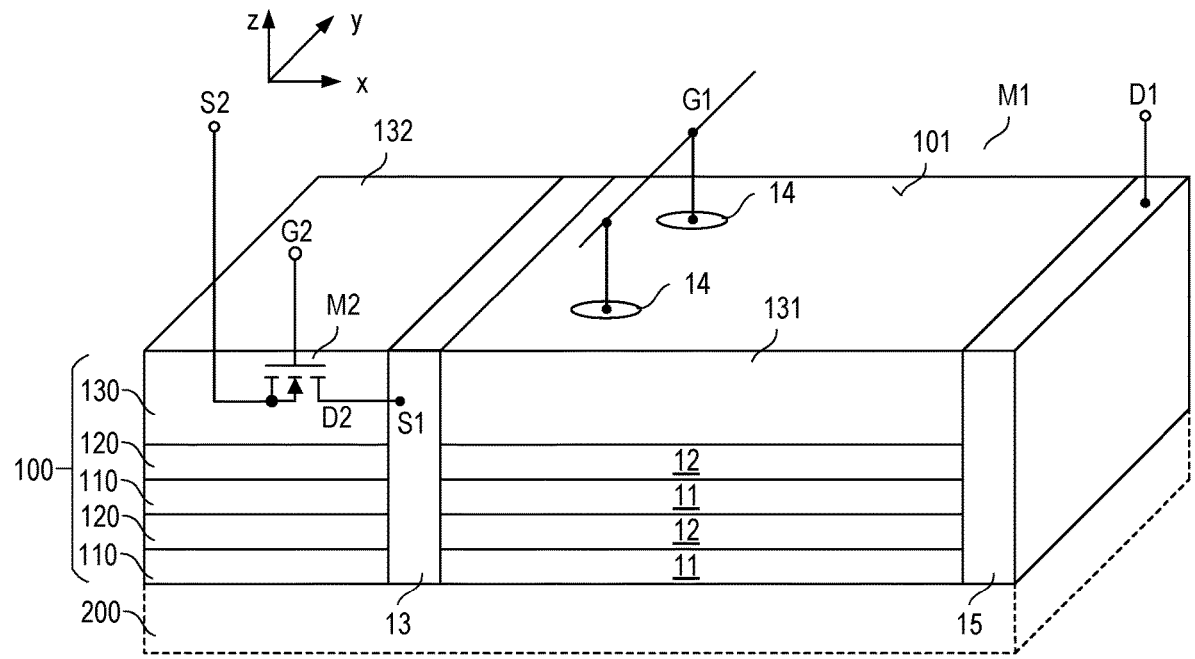
Figure 1B:
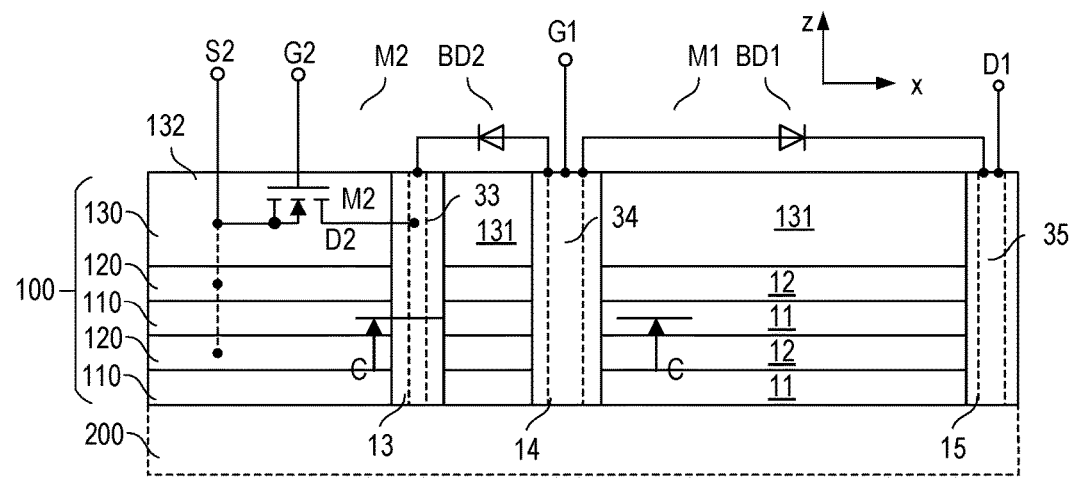

FIGS. 1A to 1C show a perspective sectional view (FIG. 1A), a vertical cross-sectional view (FIG. 1B), and a horizontal cross-sectional view (FIG. 1C) of a semiconductor arrangement that includes a first semiconductor device M1 and a second semiconductor device M2. The first semiconductor device M1 and the second semiconductor device M2 are implemented as transistor devices in FIGS. 1A to 1C. The semiconductor arrangement includes a layer stack with a plurality of first semiconductor layers 110 of a first doping type and a plurality of second semiconductor layers 120 of a second doping type that are arranged alternatingly. The second doping type is complementary to the first doping type. A source region 13 of the first transistor device M1 adjoins the plurality of first semiconductor layers 110, and a drain region 15 of the first transistor device M1 adjoins the plurality of first semiconductor layers 110 and is located spaced apart from the source region 13 in a first direction x (horizontal direction). The source region 13 of the first transistor device M1 is also referred to as first source region or fifth semiconductor region 13 in the following, and the drain region 15 of the first transistor device M1 is also referred to as first drain region or first semiconductor region 15 in the following. The semiconductor arrangement further includes a plurality of gate regions 14 of the first transistor device M1. Each of the plurality of gate regions 14 adjoins at least one of the plurality of second semiconductor layers 120, is arranged between the first source region 13 and the first drain region 15, and is spaced apart from the first source region 13 and the first drain region 15.

As used herein, a layer or region of the first doping type is a layer or region with an effective doping of the first doping type. Such region or layer of the first doping type, besides dopants of the first doping type, may also include dopants of the second doping type, but the dopants of the first doping type prevail. Equivalently, a layer or region of the second doping type is a layer or region with an effective doping of the second doping type and may contain dopants of the first doping type.

Referring to FIGS. 1A to 1C, the semiconductor arrangement further includes a third semiconductor layer 130 that adjoins the layer stack with the first layers 110 and the second layers 120 and each of the first source region 13, the first drain region 15, and the gate regions 14. Active regions of the second transistor device M2 are integrated in the third semiconductor layer 130 in a second region 132. The second region 132 is spaced apart from a first region 131 of the third semiconductor layer 130, wherein the first region 131 is bordered by the first source region 13 and the first drain region 15. At least the first region 131 may be a region of the second doping type. The second transistor device M2 is only schematically illustrated in FIGS. 1A and 1B and represented by a circuit symbol.

The third semiconductor layer 130 and the layer stack with the first and second semiconductor layers 110, 120 form an overall layer stack 100, which is also referred to as semiconductor body 100 in the following. The semiconductor body 100 may include a conventional semiconductor material such as, for example, silicon (Si), silicon carbide (SiC), gallium nitride (GaN), gallium arsenide (GaAs), or the like. The semiconductor body 100 may be arranged on any kind of carrier 200 (illustrated in dashed lines in FIGS. 1A and 1B).

According to one example, the overall number of first layers 110 in the layer stack equals the overall number of second layers 120. In the example shown in FIGS. 1A and 1B, an uppermost layer of the layer stack is a second layer 120 and a lowermost layer is a first layer 110. The "uppermost layer" is the layer adjoining the third layer 130, and the lowermost layer is the layer spaced apart from the uppermost layer most distantly. However, implementing the uppermost layer as a second layer 120 and the lowermost layer as a first layer 110 is only an example. According to another example, not shown, the uppermost layer is a first layer and the lowermost layer is a second layer. Just for the purpose of illustration, the layer stack with the first and second layers 110, 120 includes two first layers 110 and two second layers 120, that is, four layers overall. This, however, is only an example. According to one example, the overall number of layers 110, 120 in the layer stack is between 4 and 60, in particular between 6 and 30.

The first direction x, which is the direction in which the first source region 13 and the first drain region 15 are spaced apart from each other, is a first lateral direction of the semiconductor body in the example shown in FIGS. 1A to 1C. A "lateral direction" of the semiconductor body 100 is a direction parallel to a first surface 101 of the semiconductor body 100. The first and second layers 110, 120 and the third layer 130 are essentially parallel to the first surface 101 in the example shown in FIGS. 1A to 1C. In this example, each of the first source region 13 and the first drain region 15 extend in a vertical direction z in the semiconductor body 100 so that each of the first source region 13 and the first drain region 15 adjoins the third layer 130 and the first layers 110. The "vertical direction" z is a direction perpendicular to the first surface 101. Further, the gate regions 14 extend in the vertical direction z in the semiconductor body 100 so that each of the plurality of gate regions 14 adjoins each of the second semiconductor layers 120. The gate regions 14 are spaced apart from each other in a second lateral direction y. This second lateral direction y is different from the first lateral direction x and may be perpendicular to the first lateral direction x.

The first transistor device M1 is a lateral superjunction depletion device, more specifically, a lateral superjunction JFET (Junction Field-Effect Transistor). In this transistor device M1, each of the first source region 13 and the first drain region 15 is a region of the first doping type and each of the gate regions 14 is a region of the second doping type. Further, in the section of the semiconductor body 100 between the first source region 13 and the first drain region 15, the first semiconductor layers 110 form drift regions 11 and the second semiconductor layers 120 form compensation regions 12 of the superjunction device. The function of these drift and compensation regions is explained herein further below.

A type of this first transistor device M1 is defined by the first doping type. The first transistor device M1 is an n-type JFET when the first doping type is an n-type and the second doping type is a p-type. Equivalently, the first transistor device M1 is a p-type JFET when the first doping type is a p-type and the second doping type is an n-type.

According to one example, the first source region 13, the drain region 15, the plurality of gate regions 14, the first and second layers 110, 120 forming the drift and compensation regions 11, 12, and the third layer 130 are monocrystalline semiconductor regions. According to one example, these regions include monocrystalline silicon (Si) and a doping concentration of the first source region 13 is selected from a range of between 1E17 cm$^{-3}$ (=1·10$^{17}$ cm$^{-3}$) and 1E21 cm$^{-3}$, a doping concentration of the drift regions 11 is selected from a range of between 1E13 cm$^{-3}$ and 1E18 cm$^{-3}$, or between 1E14 cm$^{-3}$ and 5E17 cm$^{-3}$, and a doping concentration of the gate regions 14 is selected from a range of between 1E17 cm$^{-3}$ and 1E21 cm$^{-3}$. The doping concentration of the first drain region 15 can be selected from the same range as the doping concentration of the first source region 13, and the doping concentration of the compensation regions 12 can be selected from the same range as the doping concentration of the drift regions 11.

Referring to FIGS. 1A and 1B, the gate regions 14 of the first transistor device M1 are connected to a first gate node G1 and the first drain region 15 is connected to a first drain node D1. The first gate node G1 and the first drain node D1 are only schematically illustrated in FIGS. 1A and 1B. These nodes G1, D1 may include metallizations (not shown) on top of the semiconductor body 100. Optionally, as illustrated in dashed lines in FIG. 1B, a first connection electrode 34 may be embedded in each of the gate regions 14 and a second connection electrode 35 may be embedded in the drain region 15. The first connection electrodes 34 are connected to the gate node G1 and serve to provide a low-ohmic connection between each section of the gate regions 14 and the first gate node G1. The second electrode 35 is connected to the drain node D1 and provides a low-ohmic connection between each section of the drain region 15 and the drain node D1. Further, a third electrode 33 may be embedded in the first source region 13. Referring to FIG. 1B, each of the first, second and third connection electrodes 34, 35, 33 may extend along a complete length of the respective semiconductor region 14, 15, 13 in the vertical direction z. Each of these electrodes 34, 35, 33 includes an electrically conducting material. Examples of such electrically conducting material include, but are not restricted to: a metal such as copper (Cu), aluminum (Al), tantalum (Ta), titanium (Ti), cobalt (Co), nickel (Ni) or tungsten (W); a highly doped polycrystalline semiconductor material such as polysilicon; or a metal silicide, such as tungsten silicide (WSi), titanium silicide (TiSi), Cobalt silicide (CoSi), or nickel silicide (NiSi).

Generally, the main function of the third semiconductor layer 130 is to accommodate the second transistor device M2. Therefore, the semiconductor layer 130 is designed such that it provides sufficient space to integrate active regions of the second semiconductor M2 in the second region 132. According to one example, a thickness of the third semiconductor layer 130 in the second region 132 is at least 1 micrometer (μm), in particular at least 4 micrometers. The "thickness" is the dimension of the third layer 130 in the vertical direction z (see, e.g., FIGS. 7 and 8). According to one example, a thickness of the third semiconductor layer 130 is at least twice a thickness of a single first semiconductor layer 110 or a single second semiconductor layer 120. According to one example, a thickness of the third semiconductor layer 130 is at least twice a thickness of each of the first semiconductor layers 110 and the second semiconductor layers 120. The thickness of a single first semiconductor layer 110 or a single second semiconductor layer 120 is, for example, between 100 nanometers (nm) and 3 micrometers (μm). According to another example, a thickness of the third semiconductor layer 130 is greater than a distance between the first source region 13 and each of the gate regions 14.

In or on top of the first region 131, the semiconductor arrangement may include an edge termination structure (not shown in FIGS. 1A to 1C).

At least the first region 131 of the third semiconductor layer 130 is a region of the second doping type so that a first p-n junction is formed between the first drain region 15 and the first region 131 and a second p-n junction is formed between the first source region 13 and the first region 131. These p-n junctions are part of two bipolar diodes, a first bipolar diode BD1 formed by the gate regions 14, the first region 131 and the first drain region 15, and a second bipolar diode BD2 formed by the gate regions 14, the first region 131 and the first source region 13. In each of these bipolar diodes, the first region 131 of the third semiconductor layer 130 forms a base region. Circuit symbols of these bipolar diodes are shown in FIG. 1B. According to one example, a doping concentration of the first region 131 of the third semiconductor layer 130 is such that a voltage blocking capability of the first bipolar diode BD1 is equal to or higher than a voltage blocking capability of the first transistor device M1.

The "voltage blocking capability" of the first transistor device M1 is defined by a maximum level of a voltage between the first drain node D1 and the gate node G1, the first transistor device M1 can withstand in an off-state. Dependent on the specific design, the voltage blocking capability may range from 20V up to several 100 volts. This voltage blocking capability may be adjusted, inter alia, by suitably selecting a distance between the first gate region 14 and the first drain region 15. In a first transistor device M1 with a voltage blocking capability of 650 volts, for example, the distance may be selected from between 40 micrometers and 60 micrometers and a doping concentration of the first region 131 may be selected from a range of between 1E12 cm$^{-3}$ and 1E15 cm$^{-3}$, in particular from between 1.1 E14 cm$^{-3}$ and 4.6E14 cm$^{-3}$. The doping concentration of the first region 131 may be lower than the doping concentration of the plurality of second semiconductor layers 120, for example.

The layer stack with the first and second semiconductor layers 110, 120 adjoins the third layer 130 and, therefore, the second region 132 in which active regions of the second transistor device M2 are integrated. However, the third layer 130 and, in particular, the second region 132 is not obtained based on the first and second layers 110, 120. That is, the second region 132 is not obtained by additionally doping sections of the first and second layers 110, 120 with dopants of the second doping type in order to obtain an effective doping of the second doping type.

Referring to FIGS. 1A and 1B, the first source region 13 is electrically connected to a drain node D2 of the second transistor device M2. The second transistor device M2 further includes a gate node G2 and a source node S2. According to one example, the second transistor device M2 is a normally-off transistor device such as, for example, an enhancement MOSFET. Just for the purpose of illustration, the circuit symbol of the second transistor device M2 shown in FIGS. 1A and 1B represents an n-type enhancement MOSFET. This, however, is only an example. The second transistor device M2 may be implemented as a p-type enhancement MOSFET or a p-type or n-type depletion MOSFET as well.

Optionally, as illustrated in dashed lines in FIG. 1B, those sections of the second semiconductor layers 120 that are arranged below the second region 132 and are separated from those sections that form the compensation regions 12 are connected to the second source node S2. Connections between these second layers 120 and the second source node S2 are schematically illustrated in FIG. 1B.

The first and second transistor device M1, M2 can be interconnected in various ways. According to one example, the source node S2 of the second transistor device M2 is connected to the gate node G1 of the first transistor device M1. An electronic circuit diagram of a transistor arrangement in which the gate node G1 of the first transistor device M1 is connected to the source node S2 of the second transistor device M2 is shown in FIG. 2A. Just for the purpose of illustration and the following explanation it is assumed that the first transistor device is an n-type JFET and the second transistor device is an n-type enhancement MOSFET. The second gate node G2, the second source node S2 and the first drain node D1 are circuit nodes that may serve to connect the transistor arrangement to other devices, a power source, ground or the like in an electronic circuit.

The transistor arrangement may include a housing (package) 300 that is schematically illustrated in FIG. 2A. In this case, the second gate node G2, the second source node S2 and the first drain node D1 are external circuit nodes that are accessible outside the housing 300. According to one example, the gate node G1 of the first transistor device M1 is connected to the source node S2 of the second transistor device M2 inside the housing. A connection between the second source node S2 and the first gate node G1 may be formed by a wiring arrangement (not shown in the figures) that is located on top of the first surface 101 of the semiconductor body 100. According to another example, the first gate node G1 is accessible outside the housing 300 and the first gate node G1 is connected to the second source node S2 by a connection outside the housing 300.

Although the semiconductor arrangement includes two transistors, first transistor device (JFET) M1 and second transistor device (MOSFET), it can be operated like one single transistor. An operation state of the semiconductor arrangement is defined by an operation state of the MOSFET M2. The semiconductor arrangement acts like a voltage-controlled transistor that switches on or off dependent on a drive voltage $V_{GS2}$ received between the second gate node G2 and the second source node S2. This drive voltage is also referred to as gate-source voltage $V_{GS2}$ in the following.

The function of the semiconductor arrangement shown in FIGS. 1A-1C and 2A is explained below. Just for the purpose of explanation, it is assumed that the first transistor device M1 is an n-type JFET and the second transistor device M2 is an n-type enhancement MOSFET. Furthermore, for the purpose of explanation, it is assumed that the transistor arrangement operates as an electronic switch connected in series with a load Z, wherein a series circuit with the load Z and the transistor device receives a supply voltage V1.

Referring to FIGS. 2A-2D, the MOSFET M2 is controlled by the gate-source voltage $V_{GS2}$ received between the second gate node G2 and the second source node S2. The MOSFET M2 is in an on-state (conducting state) when a voltage level of the gate-source voltage $V_{GS2}$ is higher than a predefined threshold voltage level $V_{th1}$. In an n-type enhancement MOSFET, the threshold voltage level $V_{th1}$ is a positive voltage level. The JFET M1 is controlled by a gate-source voltage $V_{GS1}$ received between the first gate node G1 and the first source node S1. An n-type JFET, such as the JFET M1 shown in FIGS. 2A-2D, is in the on-state when a voltage level of the gate-source voltage, such as the gate-source voltage $V_{GS1}$ shown in FIGS. 2A-2D, is higher than a predefined threshold level $V_{th2}$. That is, the JFET M1 is in the on-state, when $V_{GS1} > V_{th1}$, where $V_{th1} < 0$. As the gate node G1 of the JFET M1 is connected to the source node S2 of the MOSFET M2, the gate-source voltage $V_{GS1}$ of the JFET M1 equals the inverted drain-source voltage $V_{DS2}$ of the MOSFET M2, that is, $V_{GS1} = -V_{DS2}$. The drain-source voltage $V_{DS2}$ of the MOSFET M2 is the voltage between the drain node D2 and the source node S2 of the MOSFET M2.

When the MOSFET M2 is in the on-state, a magnitude of the drain-source voltage $V_{DS2}$ is very low, so that the gate-source voltage $V_{GS1}$ of the JFET is between the negative threshold level $V_{th1}$ and zero. Thus, the JFET M1 is also in the on-state. When the MOSFET M2 switches off, the drain-source voltage $V_{DS2}$ increases until the inverted drain-source voltage $-V_{DS2}$ reaches the negative threshold voltage $V_{th1}$, so that the JFET M1 also switches off.

Referring to FIGS. 1A-1C, in the on-state of the JFET M1 and the MOSFET M2, a current can flow from the first drain node D1 via the drain region 15, the drift regions 11, the first source region 13, and the drain-source path D2-S2 of the MOSFET M2 to the second source node S2. When the MOSFET M2 switches off, the electrical potential at the first drain node D1 can increase relative to the electrical potential at the second source node S2. This increase of the electrical potential at the first drain node D1 causes an increase of the electrical potential at the first source region 13, while the electrical potential at the gate regions 14 is tied to the electrical potential at the second source node S2. The increase of the electrical potential of the first source region 13 and the drift regions 11 causes p-n junctions between the first source region 13 and the compensation regions 12, and between the gate regions 14 and the drift regions 11 to be reverse biased. Furthermore, p-n junctions between the drift regions 11 and the compensation regions 12 are reverse biased. Reverse biasing those p-n junctions causes the drift regions 11 to be depleted of charge carriers. The JFET M1 switches off as soon as the drift regions 11 between the at least two gate regions 14 and/or between the gate regions 14 and the first source region 13 have been completely depleted of charge carriers.

FIG. 1C shows a horizontal cross-sectional view of the transistor device in a horizontal section plane C-C going through one of drift regions 11. In FIG. 1C, reference character $11_1$ denotes a section of the drift region 11 between two gate regions 14, and $11_2$ denotes a section of the at least one drift region 11 between the gate regions 14 and the first source region 13. The threshold voltage $V_{th1}$ of the JFET M1 is the voltage that needs to be applied between the gate regions 14 and the first source region 13 in order to completely deplete at least one of these sections $11_1$, $11_2$. In FIG. 1C, d14 denotes a distance between two gate regions 14 in the second direction y. The magnitude (the level) of the threshold voltage $V_{th1}$ is dependent on several design parameters and can be adjusted by suitably designing these parameters. These design parameters include the (shortest) distance d14 between two gate regions 14, a doping concentration of the drift region 11 in the section $11_1$ between the gate regions 14, and a doping concentration of the compensations regions 12 (out of view in FIG. 1C) in a section that is located between the gate regions 14 and adjoins section $11_1$ of the drift regions 11.

According to one example, the drift regions 11 in the section $11_1$ between the gate electrodes 14 include a higher doping concentration than in sections $11_2$ spaced apart from the gate regions 14 in the direction of the drain region 13. This higher doped section $11_1$ counteracts an increase in the on-resistance caused by the gate regions 14, which reduce the cross section in which a current can flow between the source and drain regions 13 and 15. According to one example, the compensation regions 12 at least in parts of sections $11_1$ arranged between the gate regions 14 include a higher doping concentration than in other sections, in particular, those sections $11_3$ spaced apart from the gate electrodes 14 in the direction of the drain region 15. This higher doped section ensures that the drift regions 11 in the section $11_1$ between the gate regions 14 are depleted of charge carriers, so that the JFET M1 blocks, when the threshold voltage $V_{th1}$ is applied. According to one example, the higher doped region of the compensation regions 12 is not only arranged between the gate regions 14, but surrounds the gate regions 14 in a horizontal plane, which is a plane parallel to the first surface 101.

The MOSFET M2 is designed such that a voltage blocking capability of this MOSFET M2 equals or is higher than a magnitude of threshold voltage $V_{th1}$ of the JFET M1, that is $V_{DS2\_MAX} \geq |V_{th1}|$, where $V_{DS2\_MAX}$ is the voltage blocking capability of the MOSFET M2. The voltage blocking capability of the MOSFET M2 is the maximum voltage, the MOSFET M2 can withstand between the drain node D2 and the gate node G2.

In the example shown in FIG. 2A, the semiconductor arrangement includes three external circuit nodes, the first drain node D1, the second source node S2, and the second gate node G2. According to another example shown in FIG. 2B, additionally to these circuit nodes D1, S2, G2, the first source node S1 is also accessible. According to yet another example shown in FIG. 2C, the second transistor M2 may be deactivated by connecting the second gate node G2 with the second source node S2. In this case, only the first transistor device M1 is active and can be driven by applying a drive voltage $V_{GS1}$ between the first gate node G1 and the first source node S1. According to one example, the first drain node D1, the first gate node G1, the first source node S1, the second gate node G2, and the second source node S2 are external circuit nodes that are accessible outside the housing 300. In this case, a user/costumer may choose one of the configurations shown in FIGS. 2A to 2C by suitably connecting these circuit nodes D1, G1, S1, G2, and S2. FIG. 2D illustrates another example. In this example, the source nodes S1, S2, the drain nodes D1, D2, and the gate nodes G1, G2 of each of the first and second transistor device M1, M2 are accessible outside of the housing 300.

According to one example, the first and second layers 110, 120 are implemented such that the drift regions 11 and the compensation regions 12 are essentially balanced with regard to their dopant doses. That is, at each position in the current flow direction of the first transistor device, the amount of dopant atoms (dopant charges) in one drift region 11 essentially corresponds to the amount of dopant atoms in the neighboring compensation region 12. "Essentially" means that there may be an imbalance of up to +/−10%. That is, there may be 10% more or less dopant atoms in the drift regions 11 than in the compensation regions 12. Thus, when the first transistor device M1 is in the off-state and depletion regions (space charge regions) expand in the drift and compensation regions 11, 12 essentially each doping atom in each drift region 11 has a corresponding doping atom (which may be referred to as counter doping atom) of a complementary doping in the compensation regions 12 and the drift and compensation regions 11, 12 can completely be depleted. As commonly known, compensation regions in a superjunction transistor device, e.g., JFET M1 shown in FIGS. 1A-1C and 2A-2D, make it possible to implement the drift regions with a higher doping concentration than in a conventional, non-superjunction device. This reduces the on-resistance, which is the electrical resistance in the on-state, without decreasing the voltage blocking capability.

Figure 3A:
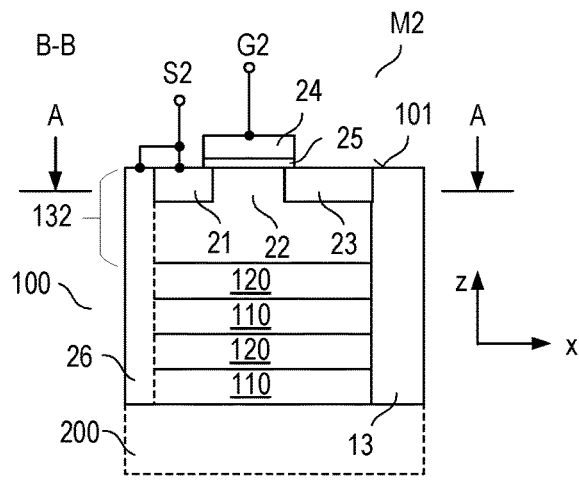
FIGS. 3A-3B illustrate one example of the second transistor device.
Figure 3B:
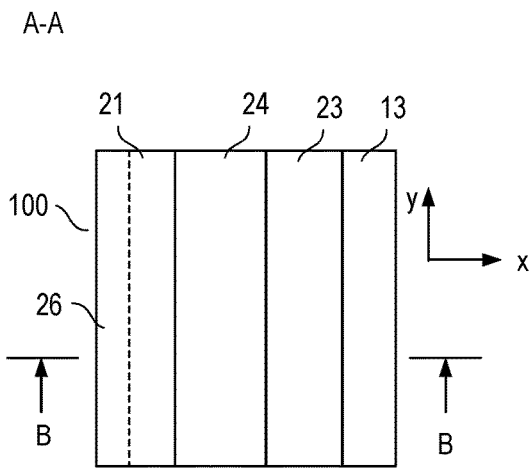

Referring to the above, the second transistor device M2 may be implemented in various ways. Some examples for implementing the second transistor M2 are explained with reference to FIGS. 3A-3B, 4, 5 and 6A-6B below. FIGS. 3A and 3B show a first example of the second transistor device M2, wherein FIG. 3A shows a vertical cross sectional view and FIG. 3B shows a horizontal cross sectional view of the second transistor device M2. Referring to FIG. 3A, the second transistor device M2 includes a source region 21 and a drain region 23 spaced apart from the source region 21 in the first lateral direction x. The drain region 23 adjoins the source region 13 of the first transistor device M1 in order to electrically connect the source region 13 of the first transistor device M1 with the drain region 23 of the second transistor device M2. The drain region 23 of the second transistor device M2 is also referred to as second drain region in the following. The source region 21 of the second transistor device M2, which is also referred to as second source region 21 in the following, and the second drain region 23 are separated by a body region 22. The body region 22 has a doping type that is complementary to the doping type of the second source region 21 and the second drain region 23. A doping concentration of the body region 22 is, for example, selected from a range of between 1E16 cm$^{-3}$ and 1E19 cm$^{-3}$, in particular from between 1E17 cm$^{-3}$ and 1E18 cm$^{-3}$.

The second transistor device M2 may be implemented as an enhancement device (normally-off device) or a depletion (normally on-device). In a normally-off device, the body region 22 adjoins the gate dielectric 25 (and the gate electrode 24, in the on-state of the second transistor device M2, generates an inversion channel in the body region 22 along the gate dielectric 25). In a normally-on device, a channel region (not shown) of the first doping is arranged between the body region 22 and the gate dielectric 25 and extends from the second source region 21 to the second drain region 23 (and the gate electrode 24, in the off-state of the second transistor device M2, depletes the channel region of charge carriers).

In the example shown in FIGS. 3A and 3B the second drain region 23 adjoins the first source region 13. This, however, is only an example. According to another example (not shown), the second drain region 23 and the first source region 13 are connected via a wiring arrangement located on top of the first surface 101 of the semiconductor body 100.

Referring to FIG. 3A, a gate electrode 24 is arranged adjacent to the body region 22 and dielectrically insulated from the body region 22 by a gate dielectric 25. This gate electrode 24 is electrically connected to the second gate node G2. The second source region 21 is electrically connected to the second source node S2. According to one example, the second transistor device M2 is an n-type transistor device. In this case, the second source region 21 and the second drain region 23 is n-doped, while the body region 22 is p-doped. According to another example, the second transistor device M2 is a p-type transistor device. In this case, the second source region 21 and the second drain region 23 are p-doped semiconductor regions, while the body region 22 is an n-doped semiconductor region. The second transistor device M2 shown in FIG. 3A is an enhancement transistor device. In this transistor device, the body region 22 adjoins the gate dielectric 25. According to another example (not shown), the second transistor device M2 is a depletion transistor device. In this case, there is a channel region of the same doping type as the second source region 21 and the second drain region 23 arranged between the body region 22 and the gate dielectric 25 and extends from the second source region 21 to the second drain region 23. Referring to FIG. 3B, which shows a horizontal cross sectional view of the second transistor device M2, the second source region 21, the second drain region 23, and the body region 22 may be elongated in the second lateral direction y of the semiconductor body 100.

Referring to FIG. 3B, a connection region 26 of the second doping type may be connected to the second source node S2 and extend through the second region 132 and the layer stack with the first and second layers 110, 120. This connection region 26 connects those sections of the second layers 120 that are arranged below the second region 132 to the second source region S2. Those sections of the first layers 110 that are arranged below the second region 132 are connected to the first source region 13 and, as the first source region 13 is connected to the second drain region 23, to the second drain region 23. Because of the fact that, below the second region 132, the second layers 120 are connected to the second source node S2 and that the first layers 110 are connected to the second drain node D2 a depletion region can expand in the first and second layer sections 110, 120 below the second region 132 when the second transistor device M2 is in the off-state.

Figure 4:
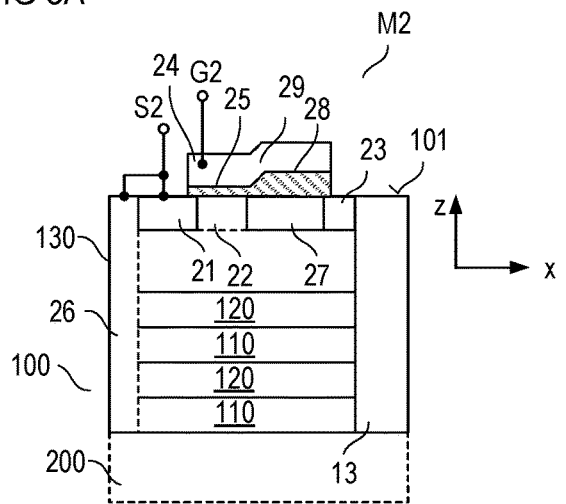
FIGS. 4, 5 and 6A-6B illustrate further examples of the second transistor device.

FIG. 4 shows a modification of the transistor device shown in FIGS. 3A and 3B. In this modification, the transistor device M2 includes a drift region 27 (which may also be referred to as drain extension) between the body region 22 and the drain region 23. The drift region 27 has a lower doping concentration than the drain region 23 and the same doping type as the drain region 23. A field electrode 29 is adjacent the drift region 27 and dielectrically insulated from the drift region 27 by a field electrode dielectric 28. According to one example, the field electrode dielectric 28 is thicker than the gate dielectric 25. As illustrated, the field electrode 29 may be electrically connected with the gate electrode 24, for example, by forming the gate electrode 24 and the field electrode as one conductive layer. This is illustrated in FIG. 4. According to another example (not shown), the field electrode 29 is electrically connected to the second source node S2 and electrically insulated from the gate electrode 24.

Figure 5:
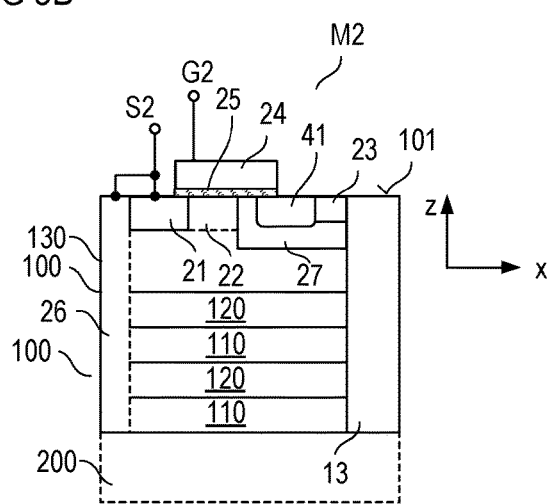

FIG. 5 shows another modification of the transistor device shown in FIGS. 3A and 3B. In the example shown in FIG. 5, the gate electrode 24 and the gate dielectric 25 overlap the drift region 27, but, in the first lateral direction x, do not extend to the drain region 23. An insulation region 41 is arranged between the drift region 27 and those regions of the first surface 101 that are not covered by the gate electrode 24 and the gate dielectric 25. This insulation region 41 may adjoin the drain region 23, as shown in FIG. 5. In this example, the drift region 27 adjoins the drain region 23 in a region spaced apart from the first surface 101. The insulation region 41 may include a conventional electrically insulating material such as an oxide. The insulation region 41 may be implemented as a so called STI (Shallow Trench Isolation) and include a thermally grown oxide.

Figure 6A:
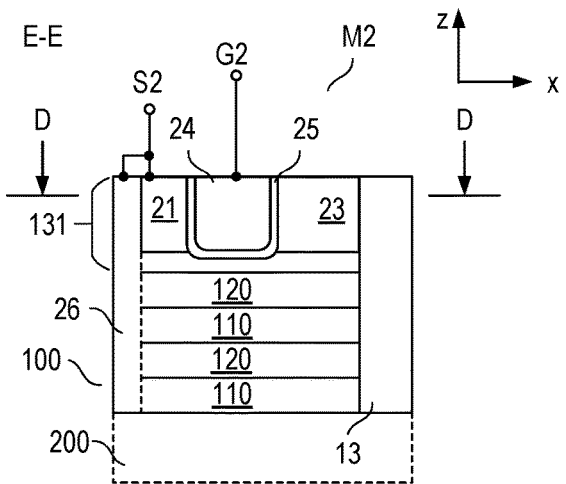
Figure 6B:
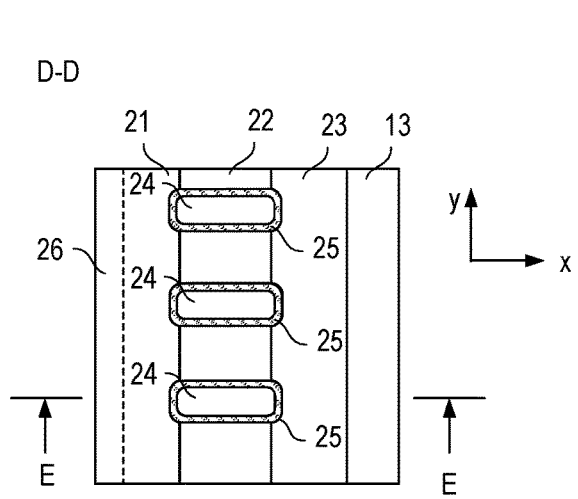

In the example shown in FIGS. 3A, 4, and 5, the gate electrode 24 is arranged on top of the first surface 101 of the semiconductor body 100. This, however, is only an example. According to another example shown in FIGS. 6A and 6B, there are several gate electrodes 24 that are arranged in trenches extending from the first surface 101 into the semiconductor body 100. Each of these gate electrodes 24, in the first lateral direction x, extends from the second source region 21 to the second drain region 23 through the body region 22 and is dielectrically insulated from these semiconductor regions 21, 22, 23 by a gate dielectric 25. Each of these gate electrodes 24 is electrically connected to the second gate node G2, which is schematically illustrated in FIG. 6A.

Second transistor devices of the type shown in FIGS. 3A to 3B, 4, 5 and 6A to 6B can be implemented using conventional implantation and oxidation processes known from integrated CMOS (Complementary Metal Oxide Semiconductor) processes. The second transistor device may therefore also be referred to as CMOS device. The second region 132 may have a basic doping of the second doping type or may be intrinsic before forming the active regions (source, body and drain regions 21, 22, 23) of the second transistor device M2 in the second region 132. The basic doping concentration can be selected such that it essentially equals the doping concentration of the body region 22 or is lower than the doping concentration of the body region 22.

Generally, when a semiconductor body 100 as has been described above is arranged in a housing 300, a cavity remaining in the housing above the semiconductor body 100 is usually filled with a molding material. Interface charges may stem from such a molding material which may migrate into the semiconductor body 100. In particular, interface charges may migrate from the first surface 101 into the third semiconductor layer 130. Some interface charges may even pass through the third semiconductor layer 130 and may subsequently migrate into the layer stack comprising the first and second semiconductor layers 110, 120. Such additional charges may negatively affect the operation of the semiconductor arrangement. Interface charges may migrate into the semiconductor body 100 especially near contacts, e.g., in regions close to the first, second and third connection electrodes 34, 35, 33 of a first transistor device M1. Charges migrating into the semiconductor body 100 may influence the compensation within a superjunction device and may reduce the blocking capability of the device. However, semiconductor devices usually should be able to block a desired breakdown voltage, even if unwanted interface charges caused by a molding material migrate into the semiconductor body 100.

Figure 7:
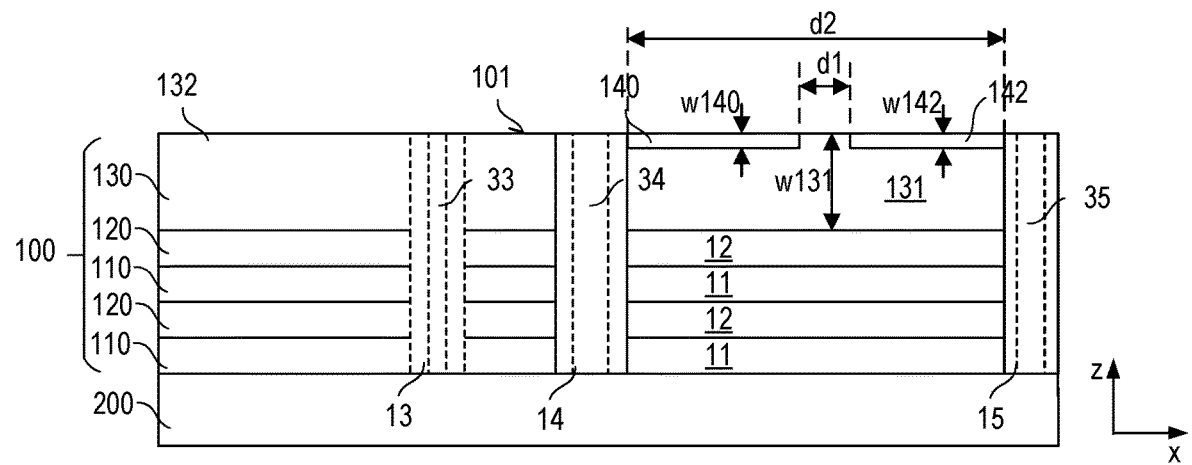
FIG. 7 shows a vertical cross-sectional view of a transistor arrangement according to one example.

A semiconductor device according to one example in which an impact of interface charges is reduced is schematically illustrated in FIG. 7. The semiconductor device includes a layer stack with a plurality of first semiconductor layers 110 of a first doping type and a plurality of second semiconductor layers 120 of a second doping type that are arranged alternatingly. The second doping type is complementary to the first doping type. A first semiconductor region 15 of a first semiconductor device M1 adjoins the plurality of first semiconductor layers 110. The semiconductor device further includes at least one second semiconductor region 14 of the first semiconductor device M1. Each of the at least one second semiconductor region 14 adjoins at least one of the plurality of second semiconductor layers 120, and is spaced apart from the first semiconductor region 15.

According to one example, the semiconductor device may include a diode. The first semiconductor region 15 may be a region of the first doping type and may form a cathode if the semiconductor device includes a diode, for example. The at least one second semiconductor region 14 may be a region of the second doping type and may form an anode if the semiconductor device includes a diode, for example. If the semiconductor device includes a diode, the fifth semiconductor region 13 (illustrated in dashed lines in FIG. 7) that has been described with respect to FIG. 1 above, may be omitted. However, the semiconductor device including a diode is merely one example.

According to another example, the semiconductor device includes a superjunction transistor device, as has been described with respect to FIGS. 1 to 6 above. Such a superjunction transistor device may comprise only the first transistor device M1, for example, while the second transistor device M2 generally is optional and may be omitted. If the semiconductor device includes a superjunction transistor device, it may further comprise the fifth semiconductor region 13 (illustrated in dashed lines in FIG. 7) which may be a region of the first doping type. As has been described above, the at least one second semiconductor region 14 may be arranged between the fifth semiconductor region 13 and the first semiconductor region 15, if a fifth semiconductor region 13 is present. The fifth semiconductor region 13 of such a first transistor device M1 adjoins the plurality of first semiconductor layers 110, as has already been described above.

In addition to the layer stack, the third semiconductor layer 130, the first semiconductor region 15 and the at least one second semiconductor region 14 (and an optional fifth semiconductor region 13), the semiconductor device according to one example includes either a third semiconductor region 140 or a fourth semiconductor region 142, or both. In the example illustrated in FIG. 7, both the third semiconductor region 140 and the fourth semiconductor region 142 are shown.

The third semiconductor region 140 extends from the first surface 101 of the semiconductor body 100 into the third semiconductor layer 130 in the vertical direction z. The third semiconductor region 140 is arranged in the first region 131 of the third semiconductor layer 130, with the first region 131 being arranged between the first semiconductor region 15 and the at least one second semiconductor region 14 in the first direction x. The third semiconductor region 140 may extend from the at least one second semiconductor region 14 towards the first semiconductor region 15 in the first direction x. The third semiconductor region 140 may be of the first or the second doping type. According to one example, the third semiconductor region 140 is of the same doping type as the at least one second semiconductor region 14, e.g., the second doping type.

The fourth semiconductor region 142 extends from the first surface 101 of the semiconductor body 100 into the third semiconductor layer 130 in the vertical direction z. The fourth semiconductor region 142 is arranged in the first region 131 of the third semiconductor layer 130. The fourth semiconductor region 142 extends from the first semiconductor region 15 towards the at least one second semiconductor region 14 in the first direction x. The fourth semiconductor region 142 may be of a doping type complementary to the doping type of the third semiconductor region 140. That is, if the third semiconductor region 140 is of the first doping type, the fourth semiconductor region 142 is of the second doping type, and vice versa. According to one example, the fourth semiconductor region 142 is of the same doping type as the first semiconductor region 15, e.g., the first doping type. If the semiconductor device only includes the third semiconductor region 140, it may be either of the first doping type or of the second doping type. The same applies for the fourth semiconductor region 142. If the semiconductor device only includes the fourth semiconductor region 142 but not the third semiconductor region 140, the fourth semiconductor region 142 may be of either the first doping type or the second doping type.

The third semiconductor region 140 and the fourth semiconductor region 142 may be configured to compensate unwanted interface charges. In this way, the third semiconductor region 140 and the fourth semiconductor region 142 act as shielding structures adjacent to the first surface 101 which prevent interface charges from migrating into the semiconductor body from the first surface 101 in the vertical direction z. The third semiconductor region 140 and the fourth semiconductor region 142 may also be referred to as junction termination extension regions. The semiconductor device may include either an n-type junction termination region, a p-type junction termination region, or both. The third semiconductor region 140 and the fourth semiconductor region 142 as described herein generally do not influence an on-resistance of the semiconductor device. A marginal reduction of the nominal breakdown voltage (without the presence of any interface charges) may occur, resulting from arranging the third and fourth semiconductor regions 140, 142 in the third semiconductor layer 130. This is, because the forming of the third and fourth semiconductor regions 140, 142 may influence the compensation within the semiconductor device to a certain degree. However, this is generally acceptable, given the advantages coming with such junction termination extension regions.

As is illustrated in FIG. 7, the third semiconductor layer 130 may have a first thickness w131 in the vertical direction z, at least in the range of the first region 131. According to one example, a thickness w131 of the third semiconductor layer 130 is at least 1 micrometer (µm), in particular at least 4 micrometers. The "thickness" is the dimension of the third layer 130 in the vertical direction z. According to one example, a thickness w131 of the third semiconductor layer 130 is at least twice a thickness of a single first semiconductor layer 110 or a single second semiconductor layer 120. According to one example, a thickness w131 of the third semiconductor layer 130 is at least twice a thickness of each of the first semiconductor layers 110 and the second semiconductor layers 120. The thickness of a single first semiconductor layer 110 or a single second semiconductor layer 120 is, for example, between 100 nanometers (nm) and 3 micrometers (µm). According to another example, a thickness w131 of the third semiconductor layer 130 is greater than a distance between the first semiconductor region 13 and each of the second semiconductor regions 14.

The third semiconductor region 140 may have a second thickness w140 in the vertical direction z which is less than the first thickness w131. The fourth semiconductor region 142 may have a third thickness w142 in the vertical direction z which is less than the first thickness w131. The second thickness w140 and the third thickness w142 may be equal or may differ from each other.

In a semiconductor device including both the third semiconductor region 140 and the fourth semiconductor region 142, the third semiconductor region 140 may be spaced apart from the fourth semiconductor region 142 in the first direction x. A distance d1 between the third semiconductor region 140 and the fourth semiconductor region 142 in the first direction x may be between 0% and 50% of a distance d2 between the first semiconductor region 15 and the at least one second semiconductor region 14 in the first direction x. That is, there may be sections of the first region 131 directly adjoining the first surface 101, without either the third semiconductor region 140 or the fourth semiconductor region 142 being arranged between the first region 131 and the first surface 101. However, according to one example, the third semiconductor region 140 and/or the fourth semiconductor region 142 may almost completely cover the first region 131 (e.g., if d1 is only 1% of d2, namely d1=0.01*d2).

According to one example, a doping concentration of the third semiconductor region 140 equals a doping concentration of the plurality of first semiconductor layers 110. A doping concentration of the fourth semiconductor region 142 may equal a doping concentration of the plurality of second semiconductor layers 120, for example. Exemplary doping concentrations of the first semiconductor layers 110 and the second semiconductor layers 120 have already been discussed with respect to FIG. 1 above. If the semiconductor device includes both the third semiconductor region 140 and the fourth semiconductor region 142, the doping concentration of the third semiconductor region 140 may equal the doping concentration of the fourth semiconductor region 142 or may differ from the doping concentration of the fourth semiconductor region 142.

Figure 8:
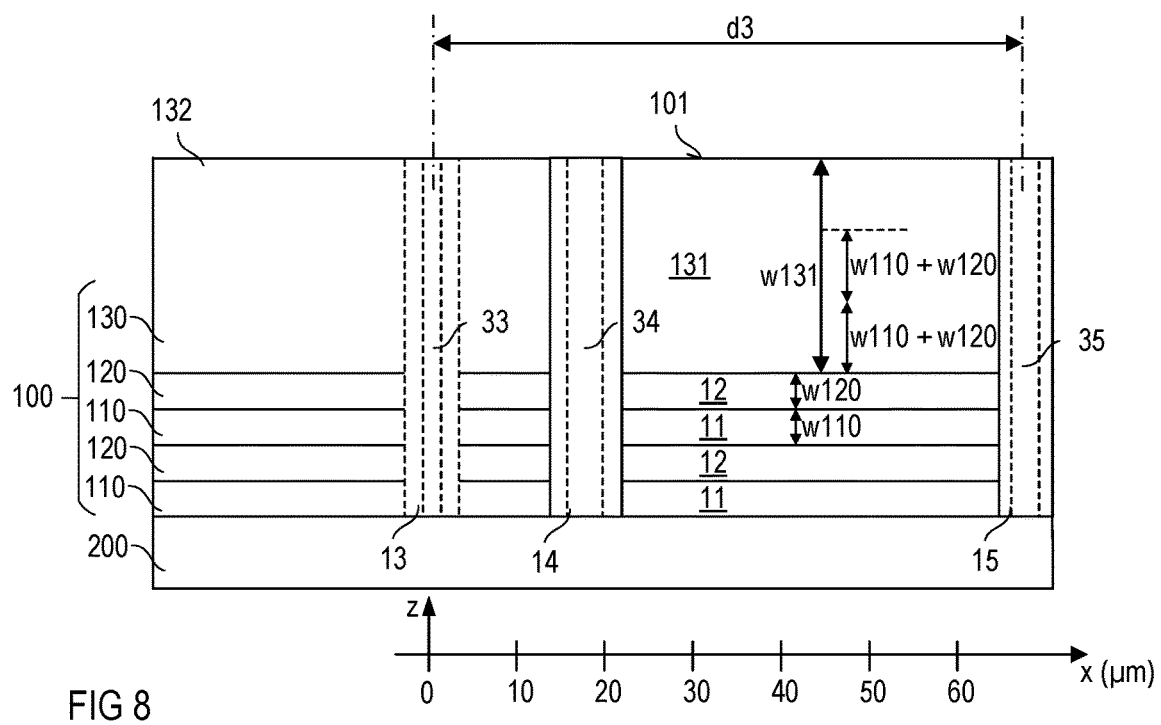
FIG. 8 shows a vertical cross-sectional view of a transistor arrangement according to another example.

A semiconductor device as illustrated in FIG. 7, however, is only one example of how a negative effect of interface charges may be reduced. Another example of a semiconductor device is illustrated in FIG. 8. The semiconductor device illustrated in FIG. 8 does not include a third and a fourth semiconductor region 140, 142. Instead, the thickness w131 of the third semiconductor layer 130 is increased, at least in the first region 131. The thickness of the third semiconductor layer 130, however, may also be increased in the second region 132. By increasing the thickness of the third semiconductor layer 130, interface charges migrating into the third semiconductor layer 130 are prevented from migrating through the entire thickness w131 of the third semiconductor layer 130. Interface charges, therefore, cannot reach the underlying layer stack. In conventional semiconductor devices, wherein the thickness w131 of the third semiconductor layer 130 is between about 1 µm and about 4 µm (see FIG. 1 above), interface charges may penetrate through the third semiconductor layer 130, reach the underlying layer stack, and may negatively affect the function of the semiconductor device. By increasing the thickness of the third semiconductor layer 130, the distance the interface charges have to travel through the third semiconductor layer 130 until they reach the layer stack is increased. Further, a thick third semiconductor layer 130 causes a relaxation of equipotential lines within the third semiconductor layer 130, as the impact of the interface charges on the electrical field within the semiconductor device is reduced. This increases the blocking capability of the semiconductor device (without interface charges) to a certain degree. The on-resistance is not affected by increasing the thickness w131 of the third semiconductor layer 130.

According to one example, each of the plurality of first semiconductor layers has a thickness w110 in the vertical direction z, and each of the plurality of second semiconductor layers 120 has a thickness w120 in the vertical direction z. A thickness w131 of the third semiconductor layer 130 may be at least twice the sum of the thickness w110 a first semiconductor layer 110 and the thickness w120 of a second semiconductor layer 120, that is, w131≥2*(w110+w120). For example, the thickness w131 of the third semiconductor layer 130 may be between 4 µm and 24 µm.

According to one example, the semiconductor device of FIG. 8 with an increased thickness of the third semiconductor layer 130 may further include a third semiconductor region 140, or a fourth semiconductor region 142, or both.

That is, the embodiment described with respect to FIG. 7 may be combined with the embodiment described with respect to FIG. 8.

Figure 11:
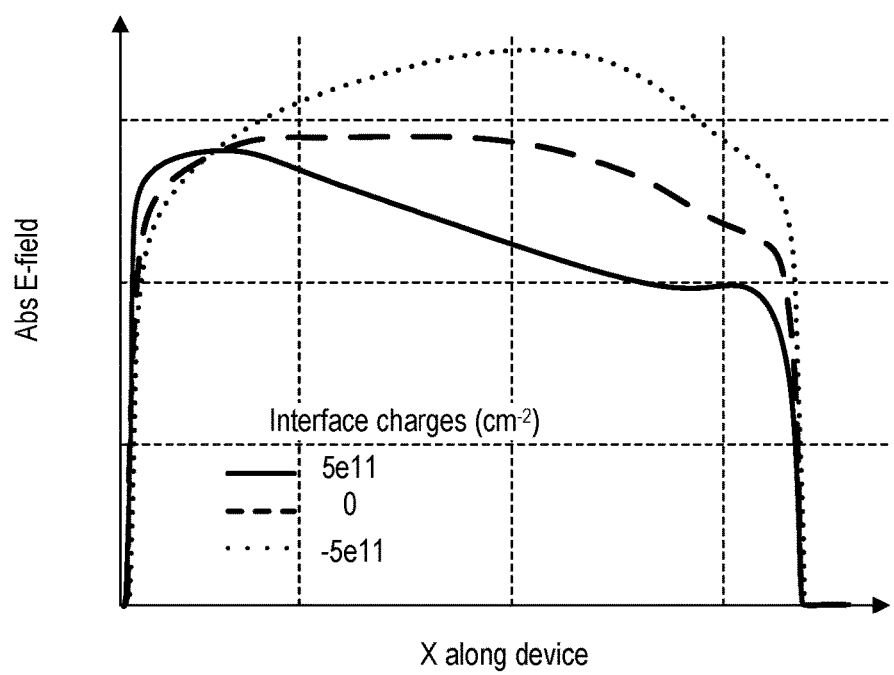
FIGS. 11 and 12 illustrate an electric field within different transistor arrangements depending on the interface charges occurring in the respective transistor arrangement.

Referring to FIG. 11, the impact of interface charges on the electric field within the semiconductor device is schematically illustrated. The diagram illustrated in FIG. 11 illustrates the strength of the electric field at different positions between the (optional) fifth semiconductor region 13 and the first semiconductor region 15 in the first direction x. In FIG. 11, no specific values are specified for the electric field and for the distance between the fifth semiconductor region 13 and the first semiconductor region 15 in the first direction x. FIG. 11 exemplarily illustrates the resulting electric field for a semiconductor device including a third semiconductor layer 130 with a thickness w131 of 4 µm, for an interface charge of zero (dashed line), for a positive interface charge of 5E11 $cm^{-2}$, and for a negative interface charge of −5E11 $cm^{-2}$ for a conventional semiconductor device, as has been described with respect to FIG. 1 above. As can be seen, the interface charges affect the electrical field to a relatively high degree.

Figure 12:
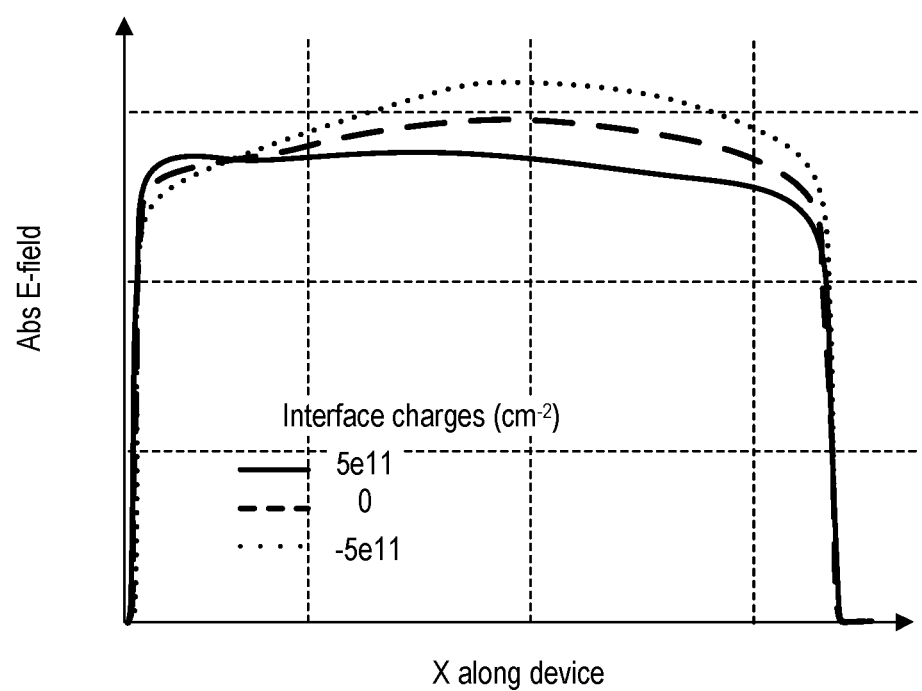

Compared to this, the electrical field within the semiconductor device for an embodiment according to FIG. 8 is exemplarily illustrated in FIG. 12. Again, no specific values are specified for the electric field and for the distance between the fifth semiconductor region 13 and the first semiconductor region 15 in the first direction x. The dimension of the semiconductor device in the first direction x, however, is the same as for the example illustrated in FIG. 11. The thickness w131 of the third semiconductor layer 130 has been increased to 24 µm. FIG. 12 exemplarily illustrates the resulting electric field for an interface charge of zero (dashed line), for a positive interface charge of 5E11 $cm^{-2}$, and for a negative interface charge of −5E11 $cm^{-2}$. As can be seen, the effect of the interface charges on the electric field is significantly reduced. While in a conventional semiconductor device the electric field may be locally reduced or increased by the presence of interface charges, the deviations in a device having a third semiconductor layer 130 with an increased thickness w131 are less distinct.

Figure 9A:
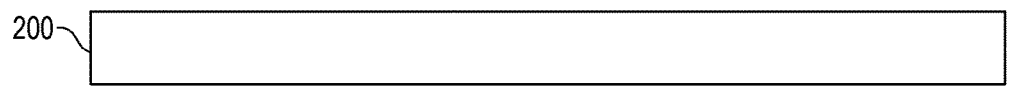
FIGS. 9A-9E illustrate one example of a method for forming a transistor arrangement.

Now referring to FIGS. 9A-9E, a method for producing a semiconductor device is exemplarily illustrated. Referring to FIG. 9A, a carrier 200 may be formed or provided. The carrier 200 may be made of a semiconductor material, for example, such as silicon (Si), silicon carbide (SiC), gallium nitride (GaN), gallium arsenide (GaAs), or the like. Now referring to FIG. 9B, an epitaxial layer is formed on the carrier 200 in the vertical direction z. Forming the epitaxial layer may comprise depositing a layer of semiconductor material on the carrier 200. For example, the layer of semiconductor material may include a conventional semiconductor material such as, for example, silicon (Si), silicon carbide (SiC), gallium nitride (GaN), gallium arsenide (GaAs), or the like. After depositing the layer of semiconductor material, a plurality of implantation regions is formed in the semiconductor material (not explicitly illustrated in FIG. 9B). The number of implantation regions that are formed in the epitaxial layer may equal the desired number of first and second semiconductor layers 110, 120. Each implantation region may either be of the first type or the second type, with implantation regions of the first and the second type arranged alternatingly in the vertical direction z.

After forming the first and second implantation regions, the arrangement may be heated (not specifically illustrated). By heating the first and second implantation regions, the implanted ions may be diffused, thereby forming first and second semiconductor layers 110, 120, as illustrated in FIG.

9B. Such implantation and diffusing processes are generally known and will, therefore, not be described in further detail herein.

Figure 9B:
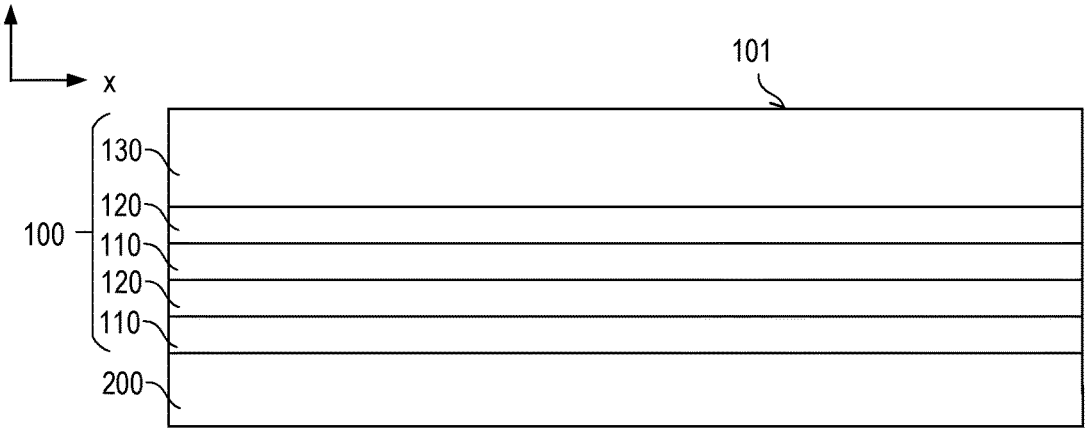

The resulting first and second semiconductor layers 110, 120 are arranged alternatingly, forming a layer stack, similar to the layer stack that has been described with respect to FIG. 1 above. In FIG. 9B, four first and second semiconductor regions 110, 120 are exemplarily illustrated. The layer stack, however, may include more than four first and second semiconductor layers 110, 120, as has been described with respect to FIG. 1 above. Being arranged alternatingly, the first and second layers 110, 120 form a plurality of pn-couples (pn-junctions) in the layer stack. A third semiconductor layer 130 may be formed on a top surface of the layer stack, as is further illustrated in FIG. 9B. A top surface of the layer stack is a surface facing away from the carrier 200. The third semiconductor layer 130 may comprise monocrystalline semiconductor material. According to one example, the third layer 130 includes monocrystalline silicon (Si).

Figure 9C:
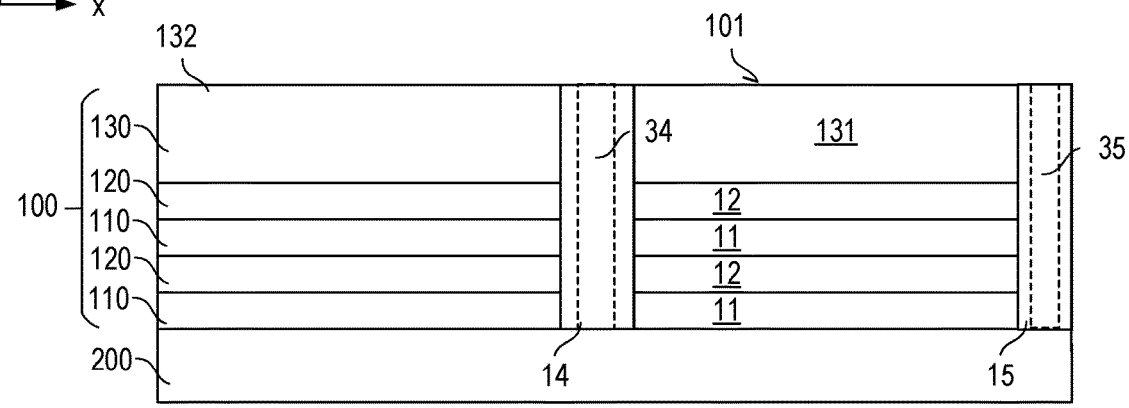

After forming the layer stack and the third layer 130, a first semiconductor device may be formed. The first semiconductor device may be at least partially integrated in the layer stack. Referring to FIG. 9C, forming the first semiconductor component may comprise forming a first semiconductor region 15 in the layer stack adjoining the plurality of first layers 110, and forming at least one second semiconductor region 14 in the layer stack, each of the at least one second semiconductor regions 14 adjoining at least one of the plurality of second layers 120. Each of the at least one second semiconductor region 14 is spaced apart from the first semiconductor region 15 in a horizontal direction x. The first semiconductor component may comprise a diode, for example, the first semiconductor region 15 forming a cathode of the diode and the at least one second semiconductor region 14 forming an anode of the diode, or vice versa.

Figure 9D:
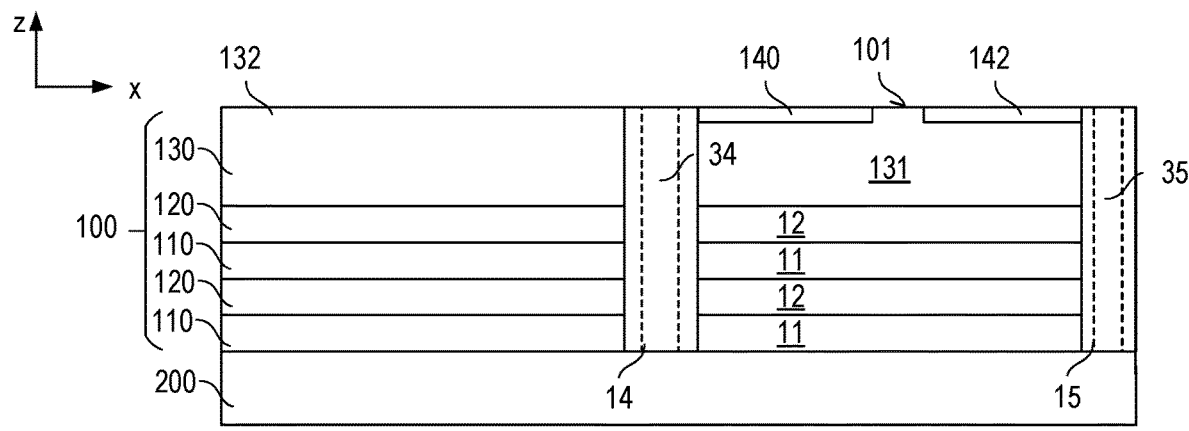
Figure 9E:
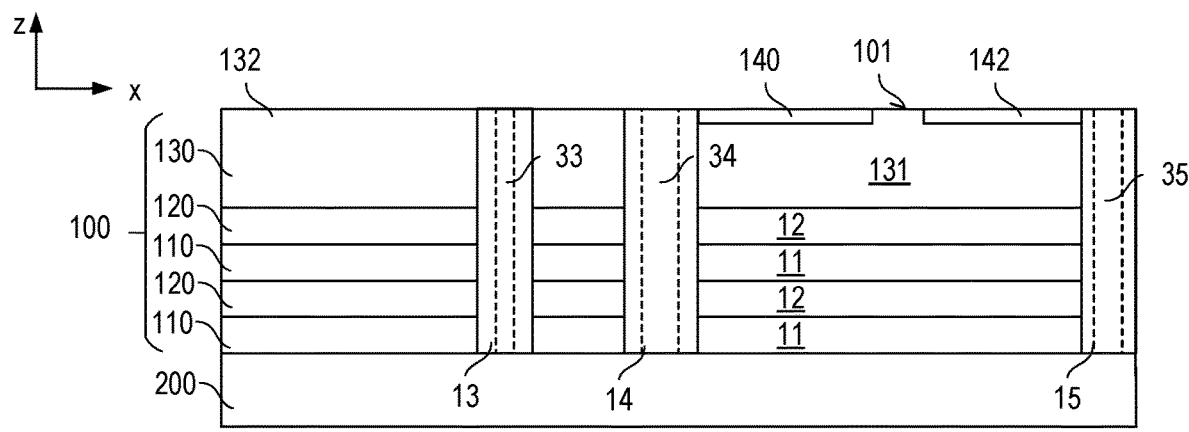

Referring to FIG. 9D, a third semiconductor region 140, or a fourth semiconductor region 142, or both (as illustrated in FIG. 9D) may be formed in the third semiconductor layer 130. For example, the third and the fourth semiconductor region 140, 142 may be formed by implanting ions of either the first type or the second type and performing a diffusion process.

The semiconductor device including a diode, however, is only an example. According to another example, the first semiconductor device may comprise at least one transistor device, as has been described with respect to FIGS. 1 to 6 above. In this case, a fifth semiconductor region 13 may be formed in the layer stack, as is exemplarily illustrated in FIG. 9E. The first, second, and fifth semiconductor regions 15, 14, 13 may correspond to the first source region 13, the first drain region 15, and the plurality of gate regions 14 of the examples illustrated in FIGS. 1 to 6 above. Optionally, first, second, and third connection electrodes 34, 35, 33 may be formed extending along a complete length of the respective semiconductor region 14, 15, 13 in the vertical direction z, as has already been described above.

A fifth semiconductor region 13 may either be formed before forming the third and fourth semiconductor regions 140, 142, or after forming the third and fourth semiconductor regions 140, 142.

Figure 10A:
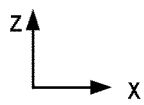
FIGS. 10A-10D illustrate another example of a method for forming a transistor arrangement.
Figure 10A:
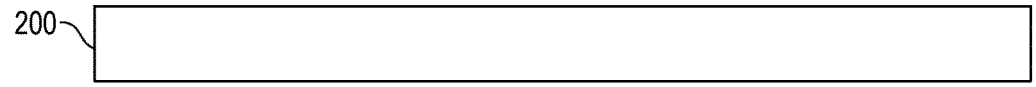

Now referring to FIGS. 10A-10D, another method for producing a semiconductor device is exemplarily illustrated. Referring to FIG. 10A, a carrier 200 may be formed or provided. The carrier 200 may be made of a semiconductor material, for example, such as silicon (Si), silicon carbide (SiC), gallium nitride (GaN), gallium arsenide (GaAs), or the like. Now referring to FIG. 10B, an epitaxial layer is formed on the carrier 200 in the vertical direction z. Forming the epitaxial layer may comprise depositing a layer of semiconductor material on the carrier 200. For example, the layer of semiconductor material may include a conventional semiconductor material such as, for example, silicon (Si), silicon carbide (SiC), gallium nitride (GaN), gallium arsenide (GaAs), or the like. After depositing the layer of semiconductor material, a plurality of implantation regions is formed in the semiconductor material (not explicitly illustrated in FIG. 10B). The number of implantation regions that are formed in the epitaxial layer may equal the desired number of first and second semiconductor layers 110, 120. Each implantation region may either be of the first type or the second type, with implantation regions of the first and the second type being arranged alternatingly in the vertical direction z.

Figure 10B:
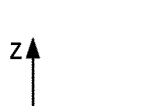
Figure 10B:
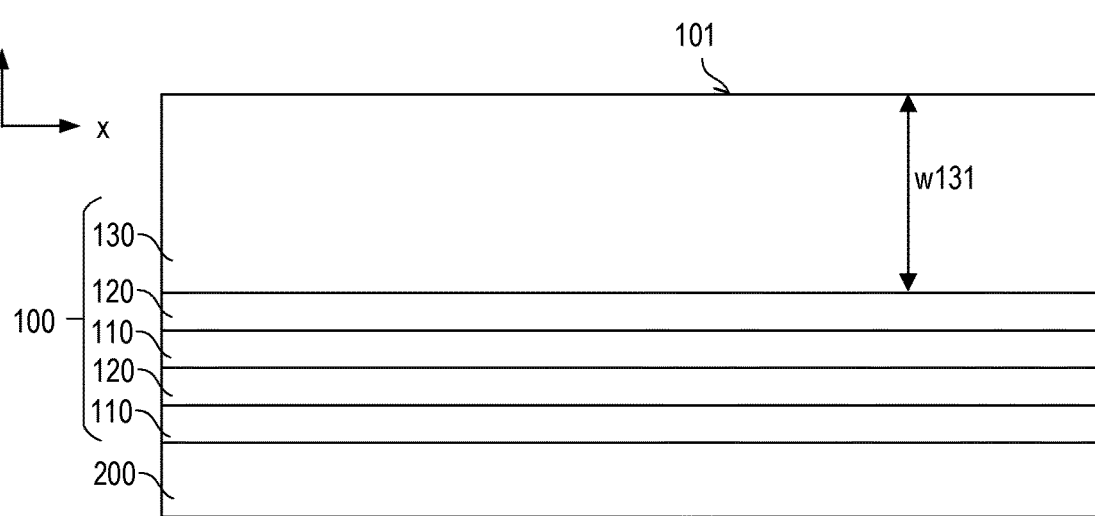

After forming the first and second implantation regions, the arrangement may be heated (not specifically illustrated). By heating the first and second implantation regions, the implanted ions may be diffused, thereby forming first and second semiconductor layers 110, 120, as illustrated in FIG. 10B. Such implantation and diffusing processes are generally known and will, therefore, not be described in further detail herein.

The resulting first and second semiconductor layers 110, 120 are arranged alternatingly, forming a layer stack, similar to the layer stack that has been described with respect to FIG. 1 above. In FIG. 10B, four first and second semiconductor regions 110, 120 are exemplarily illustrated. The layer stack, however, may include more than four first and second semiconductor layers 110, 120, as has been described with respect to FIG. 1 above. Being arranged alternatingly, the first and second layers 110, 120 form a plurality of pn-couples (pn-junctions) in the layer stack. A third layer 130 is formed on a top surface of the layer stack, as is further illustrated in FIG. 10B. A top surface of the layer stack is a surface facing away from the carrier 200. The third layer 130 may comprise monocrystalline semiconductor material. According to one example, the third layer 130 includes monocrystalline silicon (Si). The third semiconductor layer 130 may be formed having an increased thickness w131, as has been described with respect to FIG. 8 above. The thickness w131 of the third semiconductor layer 130 may be increased by depositing more semiconductor material. The time which is needed to deposit the semiconductor material, therefore, is increased as compared to conventional semiconductor devices.

Figure 10C:
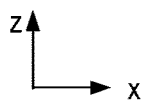
Figure 10C:
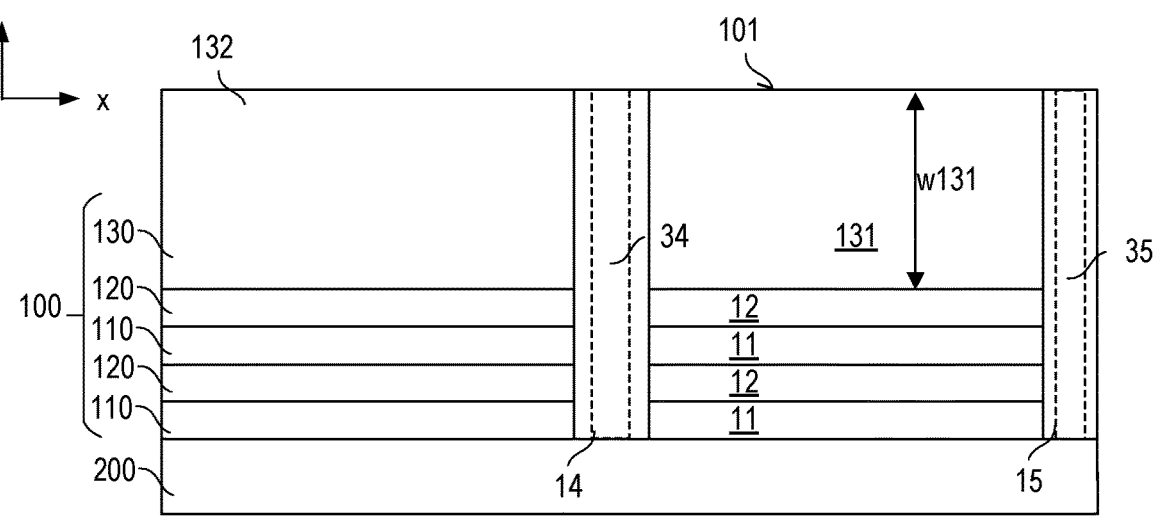
Figure 10D:
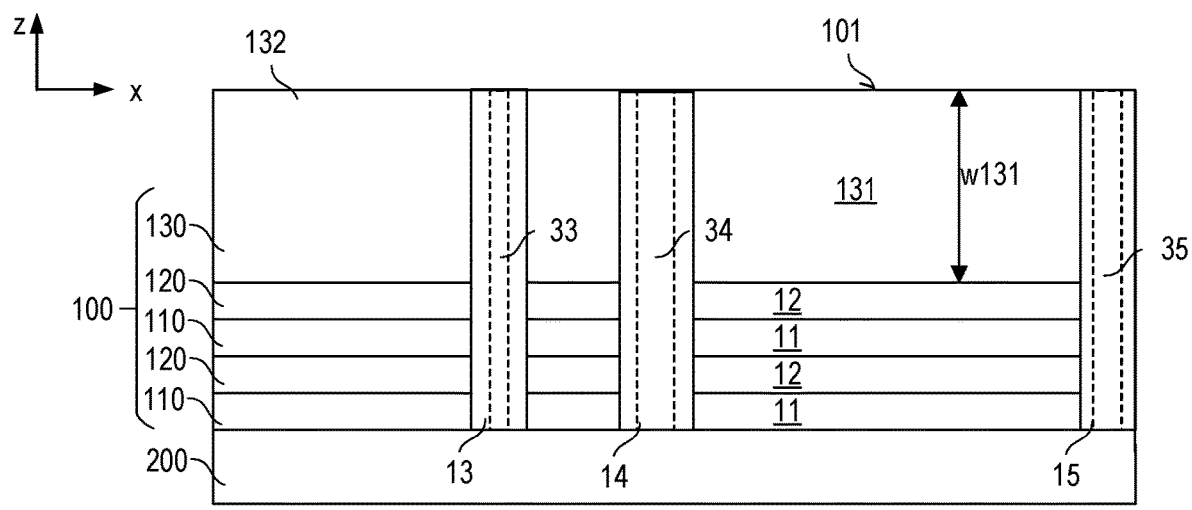

After forming the layer stack and the third layer 130, a first semiconductor component may be formed. The first semiconductor component may be at least partially integrated in the layer stack. Referring to FIG. 10C, forming the first semiconductor component may comprise forming a first semiconductor region 15 in the layer stack adjoining the plurality of first layers 110, and forming at least one second semiconductor region 14 in the layer stack, each of the at least one second semiconductor regions 14 adjoining at least one of the plurality of second layers 120. Each of the at least one second semiconductor region 14 is spaced apart from the first semiconductor region 15 in a horizontal direction x. The first semiconductor component may comprise a diode, for example, the first semiconductor region 15 forming a cathode of the diode and the at least one second semiconductor region 14 forming an anode of the diode, or vice versa.

The semiconductor device including a diode, however, is only an example. According to another example, the first semiconductor device may comprise at least one transistor, as has been described with respect to FIGS. 1 to 6 above. In this case, a fifth semiconductor region 13 may be formed in the layer stack, as is exemplarily illustrated in FIG. 10D. The first, second, and fifth semiconductor regions 15, 14, 13 may correspond to the first source region 13, the first drain region 15, and the plurality of gate regions 14 of the examples illustrated in FIGS. 1 to 6 above. Optionally, first, second, and third connection electrodes 34, 35, 33 may be formed extending along a complete length of the respective semiconductor region 14, 15, 13 in the vertical direction z, as has already been described above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a layer stack with a plurality of first semiconductor layers of a first doping type and a plurality of second semiconductor layers of a second doping type complementary to the first doping type;
   a first semiconductor region of a first semiconductor device adjoining the plurality of first semiconductor layers;
   at least one second semiconductor region of the first semiconductor device, wherein each of the at least one second semiconductor region adjoins at least one of the plurality of second semiconductor layers, and is spaced apart from the first semiconductor region;
   a third semiconductor layer adjoining the layer stack and each of the first semiconductor region, and the at least one second semiconductor region, wherein the third semiconductor layer comprises a first region arranged between the first semiconductor region and the at least one second semiconductor region in a first direction, and a third semiconductor region of the first or the second doping type, extending from a first surface of the third semiconductor layer into the first region; and
   a fourth semiconductor region of a doping type complementary to the doping type of the third semiconductor region, and extending from the first surface of the third semiconductor layer into the first region,
   wherein the first semiconductor device is a transistor device and the at least one second semiconductor region is a gate region of the transistor device, or the first semiconductor device is a diode device and the at least one second semiconductor region forms an anode of the diode device,
   wherein the third semiconductor layer has a first thickness in a vertical direction that is perpendicular to the first direction,
   wherein the third semiconductor region has a second thickness and the fourth semiconductor region has a third thickness in the vertical direction,
   wherein the second thickness and the third thickness each are less than the first thickness.

2. The semiconductor device of claim 1, wherein either the third semiconductor region is arranged adjacent to the at least one second semiconductor region and, in the first direction, extends from the at least one second semiconductor region towards the first semiconductor region, or the third semiconductor region is arranged adjacent to the first semiconductor region and, in the first direction, extends from the first semiconductor region towards the at least one second semiconductor region.

3. The semiconductor device of claim 1, further comprising a fourth semiconductor region of a doping type complementary to the doping type of the third semiconductor region, and extending from the first surface of the third semiconductor layer into the first region.

4. The semiconductor device of claim 3, wherein the third semiconductor region is arranged adjacent to the at least one second semiconductor region and, in the first direction, extends from the at least one second semiconductor region towards the first semiconductor region, and wherein the fourth semiconductor region is arranged adjacent to the first semiconductor region and, in the first direction, extends from the first semiconductor region towards the at least one second semiconductor region.

5. The semiconductor device of claim 4, wherein the fourth semiconductor region is spaced apart from the third semiconductor region in the first direction, and wherein a distance between the third semiconductor region and the fourth semiconductor region in the first direction is between 0% and 50% of a distance between the first semiconductor region and the at least one second semiconductor region.

6. The semiconductor device of claim 3, wherein a doping concentration of the third semiconductor region equals a doping concentration of the plurality of first semiconductor layers, and wherein a doping concentration of the fourth semiconductor region equals a doping concentration of the plurality of second semiconductor layers.

7. The semiconductor device of claim 1, wherein the first thickness is between 4 µm and 24 µm.

8. The semiconductor device of claim 1, wherein the fourth semiconductor region is spaced apart from the third semiconductor region in the first direction, and wherein a distance between the third semiconductor region and the fourth semiconductor region in the first direction is between 0% and 50% of a distance between the first semiconductor region and the at least one second semiconductor region in the first direction.

9. The semiconductor device of claim 1, wherein a doping concentration of the third semiconductor region equals a doping concentration of the plurality of first semiconductor layers, and wherein a doping concentration of the fourth semiconductor region equals a doping concentration of the plurality of second semiconductor layers.

10. The semiconductor device of claim 1, wherein a doping concentration of the plurality of first semiconductor layers is in a range of between 1E13 cm-3 and 1E18 cm-3, or between 1E14 cm-3 and 5E17 cm-3.

11. The semiconductor device of claim 1, wherein a doping concentration of the plurality of second semiconductor layers is in a range of between 1E13 cm-3 and 1E18 cm-3, or between 1E14 cm-3 and 5E17 cm-3.

12. The semiconductor device of claim 1, wherein a doping concentration of the first region of the third semiconductor layer is in a range of between 1E12 cm-3 and 1E15 cm-3.

13. The semiconductor device of claim 1, wherein a doping concentration of the first region of the third semiconductor layer is lower than a doping concentration of the plurality of second semiconductor layers.

14. The semiconductor device of claim 1, further comprising a fifth semiconductor region adjoining the plurality of first semiconductor layers, wherein the first semiconductor region is spaced apart from the fifth semiconductor region in the first direction, wherein the at least one second semiconductor region is arranged between the fifth semiconductor region and the first semiconductor region, and is spaced apart from the fifth semiconductor region, wherein the first semiconductor device is a first transistor device, wherein the first semiconductor region forms a drain region of the first transistor device, and wherein the fifth semiconductor region forms a source region of the first transistor device.

15. The semiconductor device of claim 14, further comprising a second transistor device at least partly integrated in a second section of the third semiconductor layer, wherein the second section is spaced apart from the first region.

16. The semiconductor device of claim 15, wherein the second transistor device comprises:
  a second source region of the first doping type;
  a second drain region of the first doping type spaced apart from the second source region;
  a body region of the second doping type adjoining the second source region and arranged between the second source region and the second drain region; and
  a gate electrode adjacent the body region and dielectrically insulated from the body region by a gate dielectric.

17. A semiconductor device, comprising:
  a layer stack with a plurality of first semiconductor layers of a first doping type and a plurality of second semiconductor layers of a second doping type complementary to the first doping type;
  a first semiconductor region of a first semiconductor device adjoining the plurality of first semiconductor layers;
  at least one second semiconductor region of the first semiconductor device, wherein each of the at least one second semiconductor region adjoins at least one of the plurality of second semiconductor layers, and is spaced apart from the first semiconductor region; and
  a third semiconductor layer adjoining the layer stack and each of the first semiconductor region, and the at least one second semiconductor regions,
  wherein each of the plurality of first semiconductor layers has a first thickness in a vertical direction that is perpendicular to the first direction,
  wherein each of the plurality of second semiconductor layers has a second thickness in the vertical direction,
  wherein the third semiconductor layer has a thickness in the vertical direction that is at least twice the sum of the first thickness and the second thickness,
  wherein the first semiconductor device is a transistor device and the at least one second semiconductor region is a gate region of the transistor device, or the first semiconductor device is a diode device and the at least one second semiconductor region forms an anode of the diode device.

18. The semiconductor device of claim 1, wherein the first semiconductor region is a drain region of the transistor device or forms a cathode of the diode device.

* * * * *

UNITED STATES PATENT AND TRADEMARK OFFICE
CERTIFICATE OF CORRECTION

PATENT NO. : 11,309,434 B2
APPLICATION NO. : 16/815621
DATED : April 19, 2022
INVENTOR(S) : A. Mahmoud et al.

It is certified that error appears in the above-identified patent and that said Letters Patent is hereby corrected as shown below:

In the Claims

Column 22, Line 11 (Claim 17), please change "regions" to -- region --.

Signed and Sealed this
Fifth Day of July, 2022

*Katherine Kelly Vidal*

Katherine Kelly Vidal
*Director of the United States Patent and Trademark Office*